(12) United States Patent
Lagouge

(10) Patent No.: US 8,932,893 B2
(45) Date of Patent: Jan. 13, 2015

(54) METHOD OF FABRICATING MEMS DEVICE HAVING RELEASE ETCH STOP LAYER

(71) Applicant: Matthieu Lagouge, Singapore (SG)

(72) Inventor: Matthieu Lagouge, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 35 days.

(21) Appl. No.: 13/868,125

(22) Filed: Apr. 23, 2013

(65) Prior Publication Data

US 2014/0312436 A1  Oct. 23, 2014

(51) Int. Cl.
*H01L 29/84* (2006.01)
*H01L 21/00* (2006.01)
*B81C 1/00* (2006.01)
*B81B 3/00* (2006.01)

(52) U.S. Cl.
CPC ........... *B81C 1/00015* (2013.01); *B81B 3/0018* (2013.01)
USPC 438/51; 257/415; 257/E29.323; 257/E21.002; 438/50

(58) Field of Classification Search
CPC ......... H01L 21/70; H01L 21/02; H01L 29/84; H01L 21/302; H01L 29/66; H01L 21/00
USPC ............. 438/48–53, 113, 706, 106, 455, 460, 438/612, 689–692, 704, 712, 723–724, 734, 438/745; 257/E21.158, E21.532, E21.002, 257/415–418, E29.323–E29.324, E21.23, 257/E23.142, E21.499
See application file for complete search history.

(56) References Cited

U.S. PATENT DOCUMENTS

| | | | |
|---|---|---|---|
| 6,792,804 B2 | 9/2004 | Adams | |
| 6,913,941 B2 | 7/2005 | O'Brien | |
| 7,250,353 B2 | 7/2007 | Nasiri | |
| 7,316,965 B2 | 1/2008 | Hooper | |
| 7,365,016 B2 | 4/2008 | Ouellet | |
| 7,779,689 B2 | 8/2010 | Li | |
| 7,919,006 B2 | 4/2011 | Park | |
| 8,138,007 B2 | 3/2012 | Geisberger | |
| 2002/0159218 A1* | 10/2002 | Harris et al. | 361/277 |
| 2006/0215348 A1* | 9/2006 | Won et al. | 361/277 |
| 2006/0228831 A1* | 10/2006 | Nasiri et al. | 438/113 |
| 2006/0286706 A1 | 12/2006 | Salian | |
| 2006/0286707 A1* | 12/2006 | Hooper et al. | 438/52 |
| 2008/0116534 A1* | 5/2008 | Grosjean et al. | 257/415 |
| 2008/0194053 A1* | 8/2008 | Huang | 438/53 |
| 2009/0111267 A1* | 4/2009 | Park et al. | 438/692 |
| 2010/0193884 A1* | 8/2010 | Park et al. | 257/414 |
| 2011/0001277 A1 | 1/2011 | Kanematsu et al. | |
| 2011/0049648 A1* | 3/2011 | Geisberger | 257/415 |
| 2011/0174074 A1 | 7/2011 | Li | |

(Continued)

*Primary Examiner* — Amar Movva
*Assistant Examiner* — Sheikh Maruf
(74) *Attorney, Agent, or Firm* — Charles Bergere

(57) ABSTRACT

A method of fabricating a microelectromechanical (MEMS) device includes bonding a transducer wafer to a substrate wafer along a bond interface. An unpatterned transducer layer included within the transducer wafer is patterned. A release etch process is then performed during which a sacrificial layer is exposed to a selected release etchant to remove at least a portion of the sacrificial layer through the openings in the patterned transducer layer. A release etch stop layer is formed between the sacrificial layer and the bond interface prior to exposing the sacrificial layer to the release etchant. The release etch stop layer prevents the ingress of the selected release etchant into the region of the MEMS device containing the bond interface during the release etch process.

4 Claims, 19 Drawing Sheets

(56) References Cited

U.S. PATENT DOCUMENTS

2012/0001277 A1* 1/2012 Park et al. .................... 257/418
2012/0313235 A1* 12/2012 Chu et al. .................... 257/692
2013/0214365 A1* 8/2013 Schlarmann et al. ......... 257/415

* cited by examiner

METHOD OF FABRICATING MEMS DEVICE HAVING RELEASE ETCH STOP LAYER

BACKGROUND OF THE INVENTION

The present invention relates generally to microelectromechanical system (MEMS) devices and, more particularly, to a method of fabricating a MEMS device having a release etch stop layer.

MEMS devices are employed as actuators and sensors in a wide variety of applications. Capacitive-sensing MEMS devices, for example, are now commonly employed in many different electronic devices to sense acceleration, vibration, device orientation, and other inertia-related parameters. Such MEMS devices operate by sensing changes in capacitance between electrodes in a transducer structure. The transducer structure may include, for example, a number of stationary electrodes or "fingers" interposed with and spaced apart from a number of movable electrodes or "fingers" in a comb-type arrangement. The movable electrodes are rigidly joined to a larger movable structure commonly referred to as a "proof mass," which is resiliently suspended over an underlying substrate. During operation of an exemplary MEMS device, a voltage differential may be applied across the stationary or movable electrodes. As the proof structure moves in response to acceleration of the MEMS device, the movable electrodes are displaced with respect to the fixed electrodes and the capacitances between the electrodes vary accordingly. By monitoring these capacitances, the acceleration or other movement of the MEMS device can be determined.

At an intermediate juncture during fabrication, the partially-fabricated MEMS device may include an unpatterned transducer layer overlying a number of sacrificial oxide layers. In one known fabrication method, which may be referred to as an engineered Silicon-On-Insulator ("eSOI") based MEMS process, separately-fabricated transducer and substrate wafers are bonded together to produce the MEMS device. If such an eSOI based MEMS process is utilized to produce the MEMS device, one or more sacrificial oxide layers may initially be formed on a substrate wafer (also commonly referred to as the "handle wafer"), which is bonded to an additional sacrificial oxide layer formed over the unpatterned transducer layer of a separate transducer wafer. The transducer wafer may also contain a patterned interconnect layer underlying the unpatterned transducer layer and interspersed with the sacrificial oxide layers. After bonding of the substrate and transducer wafers, the unpatterned transducer layer is lithographically patterned to define the primary transducer structure including the proof mass. The bulk of the sacrificial oxide layers may then be removed through the openings in the patterned transducer layer to mechanically release the proof mass. Portions of sacrificial oxide layers may be purposefully left intact, however, to provide anchor structures supporting the patterned transducer layer through the interconnect layer. Removal of the sacrificial oxide layer is commonly accomplished utilizing a release etch process wherein the sacrificial oxide layers are exposed to an oxide-selective etchant, such as a hydrogen fluoride-based etchant, for a predetermined period of time. The duration of release etch is carefully controlled to ensure complete removal of the portions of the sacrificial oxide layers directly underlying the transducer structure, while also minimizing undesired material loss from the portions of the sacrificial oxide layers forming the anchor structures.

BRIEF DESCRIPTION OF THE DRAWINGS

At least one example of the present invention will hereinafter be described in conjunction with the following figures, wherein like numerals denote like elements, and.

Figure 1:
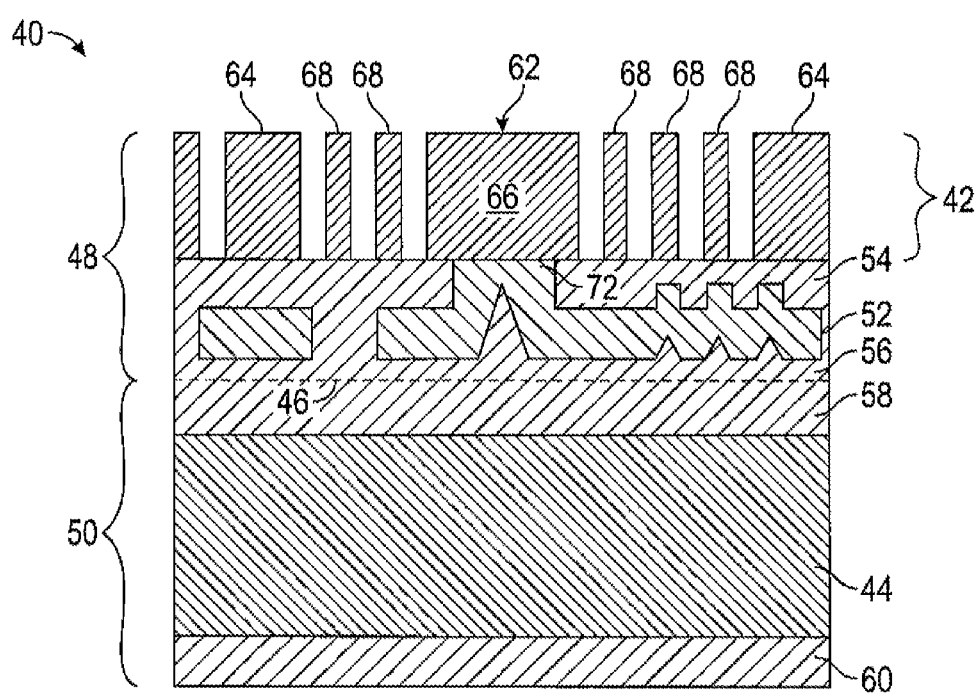
FIGS. 1 and 2 are simplified cross-sectional views of a MEMS device shown before and after the performance of a release etch, respectively, as carried-out in accordance with known processes.

For simplicity and clarity of illustration, the drawing figures illustrate the general manner of construction and may omit depiction, descriptions, and details of well-known features and techniques to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose. Finally, as still further appearing herein, terms such as "over," "under," "on," and the like are utilized to indicate relative position between two structural elements or layers and not necessarily to denote physical contact between structural elements or layers. Thus, a structure or layer may be described as fabricated "over" or "on" a substrate without indicating that the structure or layer necessarily contacts the substrate due to, for example, presence of one or more intervening layers.

FIG. 1 is simplified cross-sectional view of a partially-completed MEMS device 40 and, specifically, a capacitive-sensing MEMS accelerometer illustrated in accordance with the teachings of prior art. Only a select portion of MEMS device 40 is shown in FIG. 1, which purposefully omits certain conventionally-known features commonly included within a MEMS device, such as a MEMS cap. As illustrated in FIG. 1, MEMS device 40 includes an electrically-conductive transducer layer 42 overlying a MEMS substrate 44. Transducer layer 42 and MEMS substrate 44 may initially be included in two separate workpieces or wafers, which are bonded together during fabrication of MEMS device 40 along a bond line 46. Such a fabrication process can be utilized to produce high aspect ratio transducer structures included within MEMS devices and is referred to herein as an "eSOI based MEMS" fabrication method. The pieces or portions of these two wafers included in MEMS device 40 are referred to as a "transducer wafer portion 48" and a "substrate wafer portion 50" herein. In one embodiment, the transducer wafer and substrate wafer are silicon wafers, which are processed in bulk to produce MEMS device 40 along with a number of similar MEMS devices. The other, simultaneously-produced MEMS devices are then separated from MEMS device 40 by singulation during production to yield a large number of discrete, completed MEMS devices.

An electrically-conductive interconnect layer 52 is located between transducer layer 42 and MEMS substrate 44. Interconnect layer 52 is lithographically patterned to define a number of interconnect lines therein, along with an electrically-conductive plug portion 72 providing ohmic contact between the interconnect line or lines and the overlying transducer layer 42. In embodiments wherein MEMS device 40 is a three axis device, interconnect layer 52 may also be patterned to define additional sense electrodes for monitoring changes in capacitance along the Z-axis (identified in FIG. 2). Electrical isolation is provided between neighboring interconnect lines in interconnect layer 52 and electrically-conductive transducer layer 42 by at least one intermediate oxide layer 54. Similarly, electrical isolation is provided between electrically-conductive transducer layer 42 and MEMS substrate 44 by second and third oxide layers 56 and 58 (referred to herein as "base oxide layers 56 and 58," respectively). Oxide layer 56 can be formed as a deposited and densified oxide, while oxide layers 54 and 58 are conveniently formed as thermally-grown oxides in embodiments wherein transducer layer 42 and MEMS substrate 44 are each composed of silicon. Oxide layer 58, in particular, may be formed over the upper surface of MEMS substrate 44 (and, thus, the larger substrate wafer) utilizing a thermal growth process, in which case a fourth or bottom oxide layer 60 may likewise be grown over the bottom surface of substrate 44, although layer 60 may not be formed in all embodiments or removed if formed.

Figure 2:
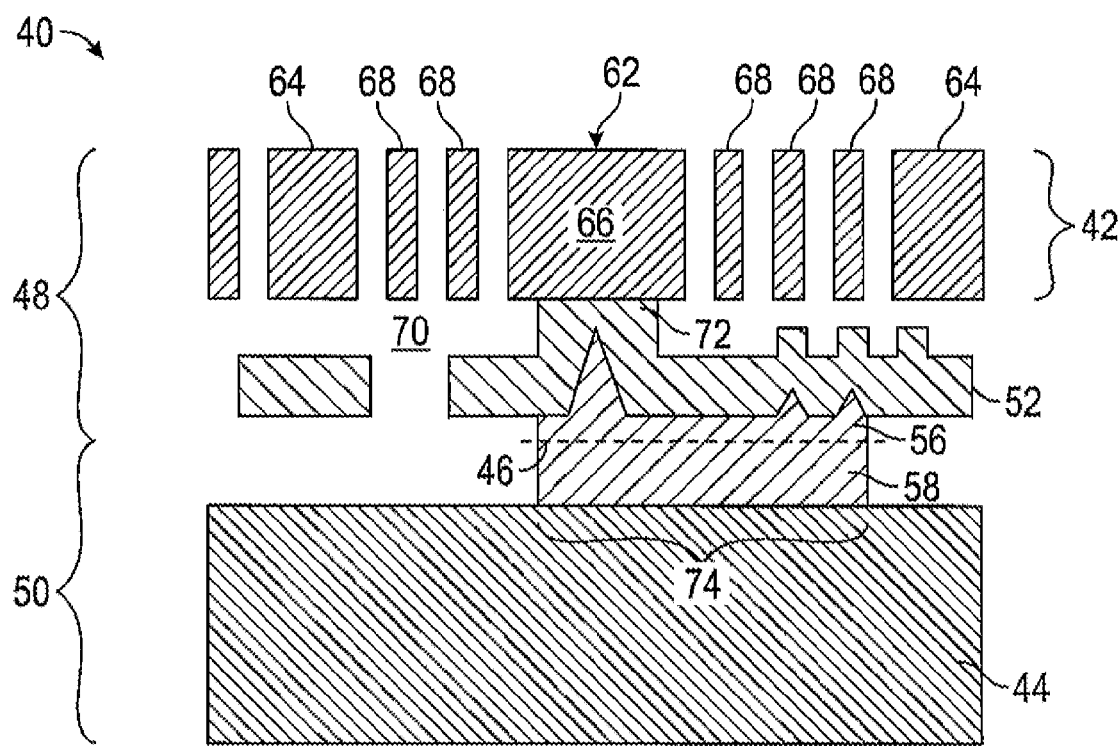

A number openings are formed in MEMS transducer layer 42 by lithographic patterning to define a primary transducer structure 62 (partially shown in FIG. 2). Primary transducer structure 62 includes a relatively large movable body or proof mass (not shown in FIG. 2), which is joined to one or more fixed regions of transducer structure 62 by a number of spring members in the conventionally-known manner. Primary transducer structure 68 may also include one or more plates having release holes or openings therein to promote the inflow of the release etchant, as described in detail below. Primary transducer structure 62 is lithographically patterned to include a patterned region 68, only a relatively limited portion of is shown in cross-section in FIG. 2 for clarity. The illustrated portion of patterned region 68 may include, for example, release openings formed in one or more plates include in primary transducer structure 62, as well as certain portions of the spring members. Primary transducer structure 62 also includes a number of fixed contact regions, which remain in ohmic contact with interconnect layer 52; e.g., as shown in FIG. 2, the illustrated portion of primary transducer structure 62 includes a contact region 68 in ohmic contact with electrically-conductive plug portion 72 of interconnect layer 52. The spring members of primary transducer structure 62 may assume the form of elongated, beam-like structures, which are compliant in the axis or axes along which MEMS device 40 senses acceleration. When MEMS device 40 is completed, the spring members deflect to allow displacement of the proof mass relative to the fixed regions of transducer layer 42 and, therefore, relative to MEMS substrate 44. At the manufacturing stage shown in FIG. 1, however, movement of the proof mass and deflection the spring members is prevented or at least impeded by intermediate oxide layer 54. Thus, to remove intermediate oxide layer 54 and thereby mechanically release the movable components of primary transducer structure 62 (the proof mass and the spring members), a time-based or time-dependent release etch process is performed in the manner described below in conjunction with FIG. 2.

FIG. 2 illustrates MEMS device 40 after the performance of a time-dependent release etch. During the release etch, intermediate oxide layer 54 is exposed to an oxide-selective etchant introduced through the openings formed in patterned transducer layer 42. The release etch results in removal of intermediate oxide layer 54 in its entirety and the creation of voided area 70 underlying the non-illustrated proof mass and the spring members. The proof mass, now resiliently suspended above MEMS substrate 44 by the spring members, can be freely displaced along the X-, Y-, and Z-axes in response to acceleration of MEMS device 40. Contact region 66 of primary transducer structure 62 remains mechanically and ohmically coupled to the underlying interconnect layer 52 by electrically-conductive plug region 72 of interconnect layer 52. Notably, the release etch has also resulted in the partial removal of base oxide layers 56 and 58 located between interconnect layer 52 and MEMS substrate 44. A portion of base oxide layers 56 and 58 has, however, intentionally been left intact to form at least one anchor structure 74, which mechanically joins the fixed central region 66 of transducer structure 62 to the underlying MEMS substrate 44 through patterned interconnect layer 52.

The present inventor has recognized that the above-described MEMS fabrication process is limited in several respects arising from the manner in which the release etch is conventionally performed. First, as indicated above by reference to the release etch as "time based" or "time dependent," the results of the release etch are strongly influenced by etch duration. If the release etch is performed for too brief a time period, sacrificial oxide layer 54 may not be fully removed, movement of the proof mass may be impeded, and MEMS device 40 may be rendered non-functional. Conversely, if the release etch is performed for an overly extended time period, excessive material removal from anchor structure 74 may occur and the mechanical integrity of MEMS device 40 may be compromised; e.g., anchor structure 74 may become undesirably thin and potentially fracture if exposed to shock or vibrational loading during wafer handling or operation of MEMS device 40. Such undesirable results can be avoided, to a certain extent, by carefully monitoring the duration of the release etch. However, even when the etch duration is tightly controlled, the rate of material removal can fluctuate significantly across iterations of the release etch process resulting in undesired variations between MEMS devices and production lots. As a result, it may be necessary to impart anchor structure 74 with oversized planform dimensions to ensure that anchor structure 74 retains sufficient bulk to provide the desired mechanical strength in instances wherein greater amounts of material loss occur during etching. Additionally, it may be necessary to form additional openings through patterned transducer layer 42 solely for the purpose of promote the ingress of etchant into certain regions of sacrificial oxide layer 54 so as to ensure complete removal layer 54 within the time allotted for the release etch. Inclusion such etchant inflow openings may result in an increase in the dimensions of primary transducer structure 62 and, therefore, an expansion of the overall footprint of MEMS device 40. Finally, to maintain the integrity of the bond interface (again, represented in FIGS. 1 and 2 by bond line 46), sacrificial oxide layers 56 and 58 may be required to have an etch rate equal to or less than that of main sacrificial oxide layer 54. This requirement may place undesired restraints on the materials from which layers 54, 56, and 58 are formed.

The following describes embodiments of a method for fabricating an exemplary MEMS device, which overcomes the above-noted limitations associated with conventional release etch processes. MEMS devices produced pursuant to the below-described fabrication method include at least one release etch stop layer, which serves as a dam or barrier to prevent or at least deter the ingress of the release etchant to certain regions of the partially-completed MEMS device. For example, the etch stop layer may prevent the ingress of the release etchant into the region of the MEMS device between an interconnect layer and an underlying MEMS substrate, which may contain fusion bonded (e.g., oxide) layers susceptible to removal by the release etchant if exposed thereto. By preventing or at least minimizing contact between these fusion bonded layers and the release etchant, significant removal of the fusion bonded layers is avoided. This effectively renders the release etch process time independent and alleviates concerns regarding excessive removal of material from anchor structures located between the interconnect layer and the MEMS substrate. A prolonged release etch can thus be performed, at least in some embodiments, to ensure removal of the sacrificial layer or layers located between the transducer layer and the interconnect layer without the provision of (or with a lesser number of) additional etchant inflow openings in the patterned transducer layer. This, in turn, allows a reduction in the overall footprint of the MEMS device. Finally, by preventing the ingress of release etchant to the region beneath the transducer layer (in particular, into the region of the MEMS device containing the bond interface), disparities in etch rate of oxide layers (or other dielectric layers) in this region become non-consequential thereby easing constraint on the materials suitable for usage in the formation of this region of the MEMS device.

An embodiment of the MEMS fabrication method is initially described in conjunction with the production of an exemplary MEMS device 80, which is shown at various stages of completion in FIGS. 3-12. The following example notwithstanding, it should be understood that embodiments of the fabrication method described herein can be utilized to produce a variety of different types of MEMS devices, which may differ form MEMS device 80 in structure and function. Furthermore, while MEMS device 80 is well-suited for usage as an accelerometer and may consequently be described below as such, it is emphasized that embodiments of the MEMS devices described herein are by no means limited to implementation as accelerometers. Rather, the fabrication methods described herein can be used to produce MEMS actuators with appropriate design modifications to produce a capacitive actuation structure, as well as other types of MEMS sensors, such as gyroscopes, magnetometers, pressure sensors, and the like. It will further be appreciated that the fabrication steps described below in conjunction with FIGS. 3-12 can be performed in alternative orders, that certain steps may be omitted, and that additional steps may be performed in alternative embodiments. Description of structures and processes known within the MEMS device and semiconductor industries may be limited or omitted entirely without providing the well-known process details.

Figure 3:
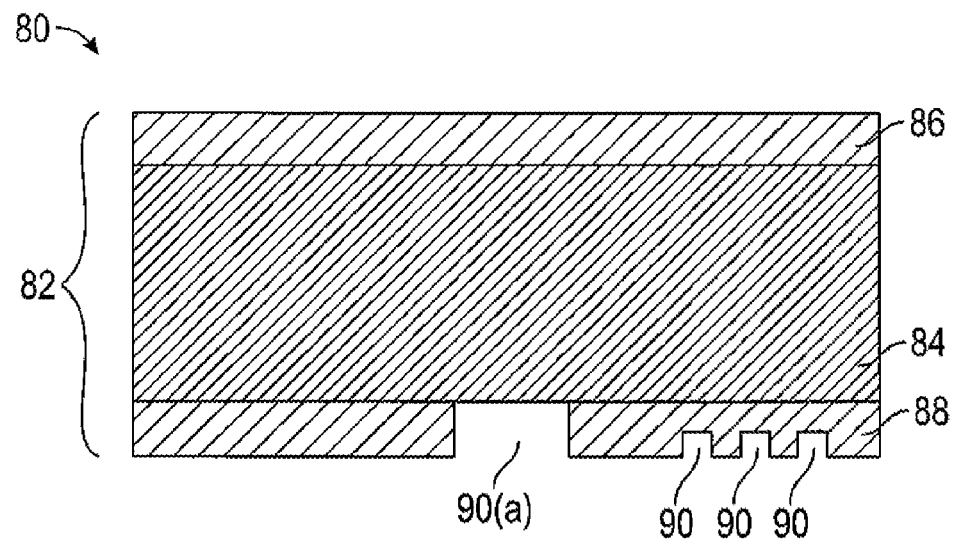
FIGS. 3-12 are simplified cross-sectional view of a MEMS devices shown at various stages of manufacture and fabricated to include at least one release etch stop layer, as illustrated in accordance with an exemplary and non-limiting embodiment of the present invention.

FIGS. 3-12 are simplified cross-sectional view of a MEMS device 80 shown at various stages of manufacture, as produced in accordance with an exemplary embodiment of the MEMS manufacturing method. Referring initially to FIG. 3, the exemplary manufacturing method commences with the provision of a transducer wafer 82 including an electrically-conductive transducer layer 84. In one embodiment, transducer wafer 82 is initially provided as a bulk silicon wafer, and transducer layer 84 is thus composed of silicon, such as single crystal silicon. In further embodiments, transducer layer 84 may comprise another electrically-conductive material. As was the case previously, only a limited portion of transducer wafer 82 is shown in FIG. 3, namely, the portion of wafer 82 that is ultimately included within MEMS device 80. It will be appreciated that a relatively large number of neighboring MEMS devices will typically be produced in parallel with MEMS device 80 over the other non-illustrated areas of the transducer wafer and the other wafer or wafers (e.g., a substrate wafer and possibly a cap wafer) to which the transducer wafer is eventually bonded, as described below. For this reason, the portion of the transducer wafer included within MEMS device 80 and shown in FIGS. 3-12 will be referred to as "transducer wafer portion 82" herein below.

At least one sacrificial layer 88 is formed over the lower surface of transducer layer 84 (again, the term "upper" utilized only to provide a frame of reference to the illustrated orientation of the transducer wafer, which may be inverted at this juncture of fabrication). Sacrificial layer 88 may comprise a number of successively-grown or successively-deposited layers; however, sacrificial layer 88 is referred to herein as a single layer for ease of explanation. Sacrificial layer 88 can be formed from any material that can be selectively removed during the below-described release etch process. This notwithstanding, sacrificial layer 88 is preferably composed of a dielectric material and, more preferably, a deposited or thermally-grown oxide. In embodiments wherein electrically-conductive transducer layer 84 is composed of silicon, sacrificial layer 88 is conveniently grown as a layer of silicon oxide utilizing a thermal oxidation processes. In this case, a dielectric (e.g., oxide) layer 86 may likewise be grown over the upper surface of transducer layer 84, as illustrated in FIG. 3. Sacrificial layer 88 may have a thickness of about 1.5 microns (μm) in an embodiment, although layer 88 may be thicker or thinner in further embodiments.

Figure 4:
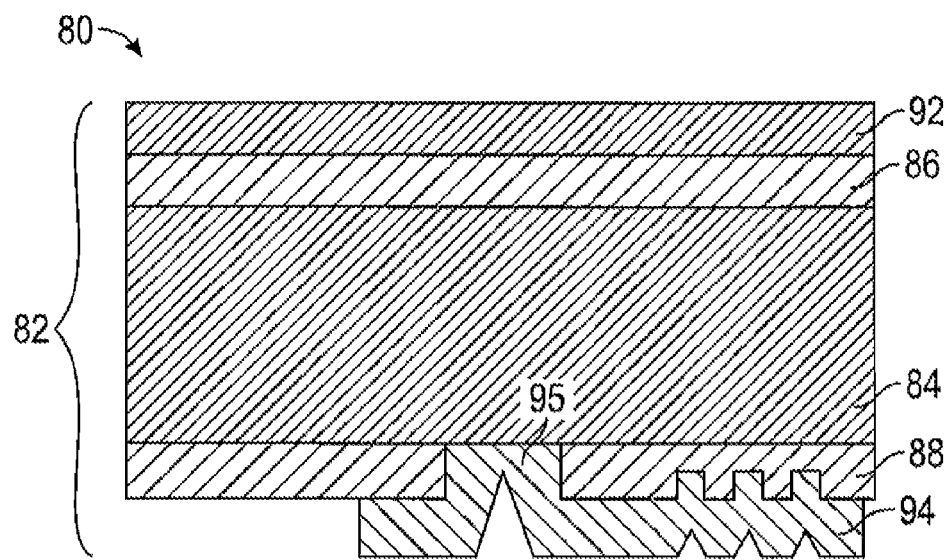

Sacrificial layer 88 is lithographically patterned to create a number of etch features 90 therein. Etch features 90 include a central opening 90(*a*) formed in sacrificial layer 88 through which transducer layer 84 is exposed. An electrically-conductive interconnect layer 94 is then deposited over the patterned sacrificial layer 88; e.g., in an embodiment, interconnect layer 94 comprises polycrystalline silicon deposited utilizing a chemical vapor deposition ("CVD") process. In other embodiments, interconnect layer 94 may be composed of a non-silicon semiconductor material or a metal. By way of non-limiting example, interconnect layer 94 may be deposited to thickness of about 2 µm. A portion of the deposited interconnect layer 94 fills openings 90(a) in patterned sacrificial layer 88 to produce an electrically-conductive plug 95, which provides ohmic contact between transducer layer 84 and interconnect layer 94. Depending upon the particular manner in which deposition is carried-out, formation of electrically-conductive interconnect layer 94 may also result in the simultaneous formation of an electrically-conductive layer 92 over upper surface of dielectric layer 86. After deposition thereof, electrically-conducive interconnect layer 94 is further lithographically patterned to define one or more interconnect lines, which provide electrical connection between the sense electrodes and contacts provided on the exterior of the completed MEMS device (not shown). Interconnect layer 94 may also be patterned to define additional features, such as one or more additional sense electrodes for monitoring changes in capacitance along the Z-axis. The resultant structure is shown in FIG. 4.

Figure 5:
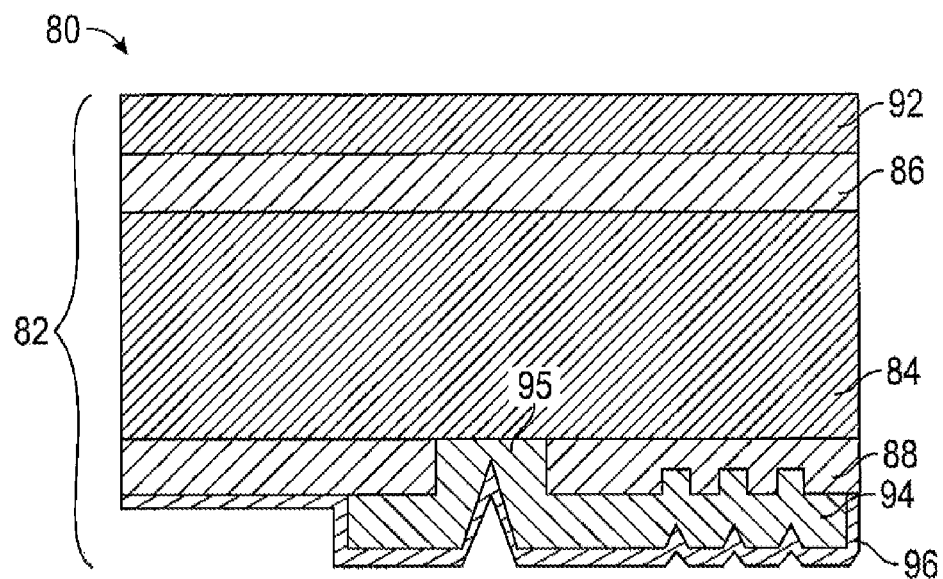
Figure 6:
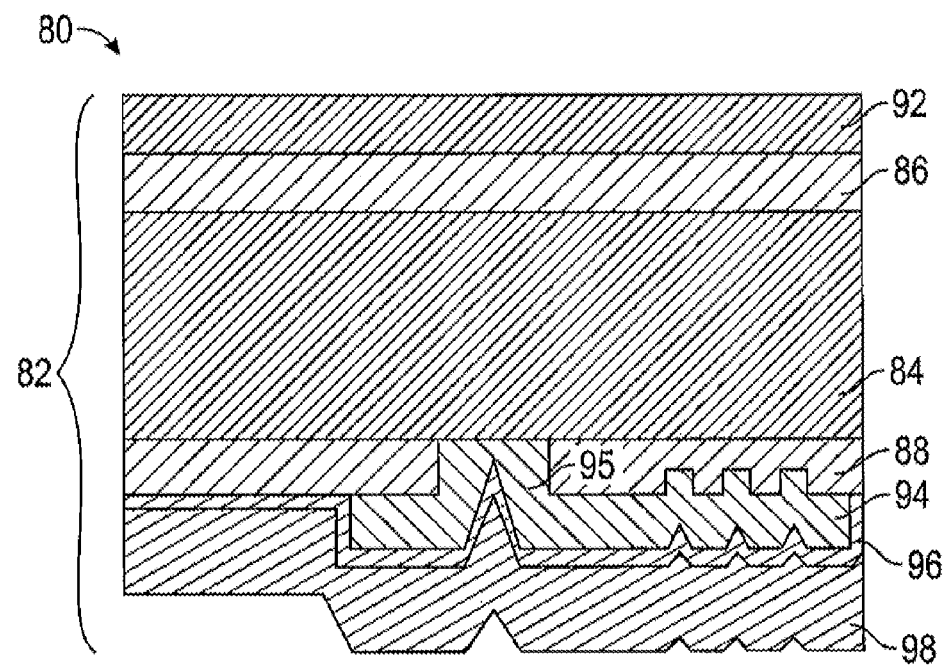
Figure 7:
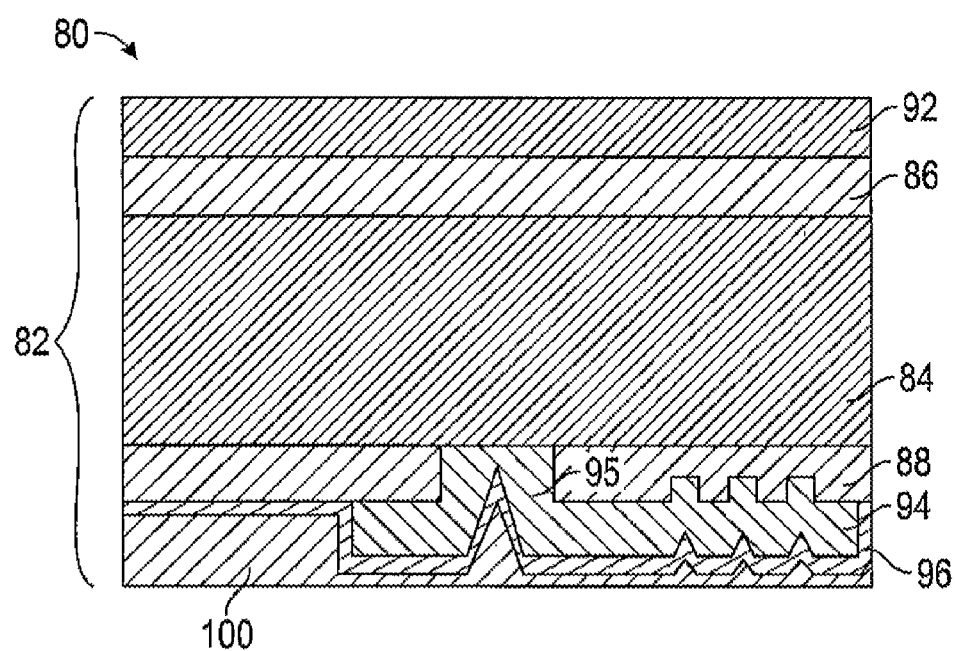

Advancing to FIG. 5, at least one release etch barrier or stop layer 96 is next formed over the lower surface of patterned interconnect layer 94. Release etch stop layer 96 can be composed of any dielectric material resistive to the etchant utilized to remove sacrificial layer 88 during the release etch process described below in conjunction with FIG. 11. The material from which release etch stop layer 96 is formed will thus vary in conjunction with the particular etchant selected for usage during the release etch and the material from which sacrificial layer 88 is formed. Release etch stop layer 96 is conveniently formed from a metal-containing material. For example, in embodiments wherein sacrificial layer 88 is an oxide and, therefore, an oxide selective etchant is chosen as the release etchant, release etch stop layer 96 may be formed from an aluminum-based material, such as an aluminum oxide (e.g., $Al_2O_3$) or aluminum fluoride (e.g., $AlF_3$), to provide but two non-limiting examples. A silicon nitride having a relatively high silicon content can also be utilized to form release etch stop layer 96, but can generate residue during the release etch process and may consequently be less desirably that the aforementioned materials. Release etch stop layer 96 can be formed over patterned interconnect layer 94 utilizing various different deposition processes, which may include CVD, a physical vapor deposition ("PVD"), and atomic layer deposition ("ALD") processes. In one embodiment, and by way of non-limiting example only, release etch stop layer 96 is deposited to a thickness between about 0.02 and about 0.2 µm.

As will be described in detail below, release etch stop layer 96 prevents or at least deters the ingress of the selected release etchant into the region beneath interconnect layer 94 containing the wafer-to-wafer bond interface during the release etch process. It is preferred, although by no means necessary, that release etch stop layer 96 completely seals this region of MEMS device 80 from any ingress the release etchant during the release etch process. The ability of release etch stop layer 96 to serve as a dam or barrier to prevent the passage of the release stop etchant therethrough can be enhanced by increasing the thickness and/or density of layer 96. In the latter regard, the density of release etch stop layer 96 can be increased after deposition utilizing a high temperature annealing process. For example, in one embodiment, release etch stop layer 96 is densified after deposition utilizing an annealing process wherein the partially-completed MEMS device 80 is heated to a predetermined maximum temperature (e.g., about 1100° C.) for a predetermined duration of time (e.g., about one hour).

As previously stated, MEMS device 80 is preferably fabricated utilizing an eSOI based MEMS process wherein the transducer wafer is bonded to a substrate or handle wafer, which are then jointly processed to yield a number of MEMS devices later separated via singulation. In such embodiments, sacrificial layer 88 may be considered a buried oxide or "BOX" layer when composed of an oxide, such as a deposited silicon oxide of the type previously described. In embodiments wherein MEMS device 80 is fabricated utilizing such an eSOI based MEMS process, one or more additional layers of material may now be formed over release etch stop layer 96 to facilitate bonding of the transducer wafer (including the illustrated transducer wafer portion 82) to a substrate or handle wafer. In this regard, and with reference to FIG. 6, at least one oxide layer 98 well-suited for fusion bonding to a similar oxide layer included within a substrate wafer may now be formed over release etch stop layer 96 utilizing PVD, CVD, or other deposition process. In one specific implementation, layer 98 is conformally deposited over the lower surface of release etch stop layer 96 as silicon oxide utilizing a low temperature Plasma-Enhanced CVD (PECVD) performed utilizing silane ($SiH_4$) or tetraethylorthosilicate (Si$(OC_2H_5)_4$ or "TEOS") chemistry. Oxide layer 98 may be deposited to a thickness of about 4 µm, in an embodiment. After deposition, oxide layer 98 may be densified via annealing and subsequently planarized utilizing, for example, to a Chemical Mechanical Planarization ("CMP") process to yield planar densified oxide layer 100 shown in FIG. 7.

Figure 8:
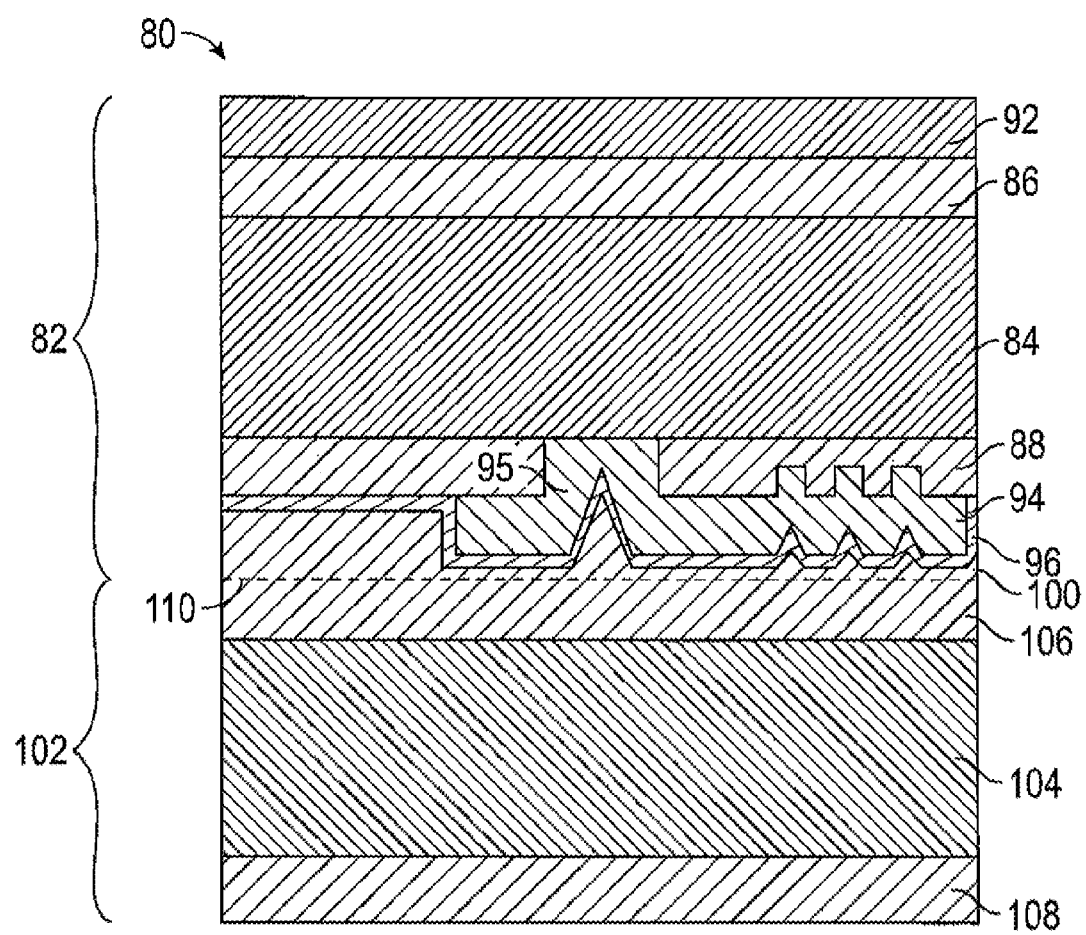

The transducer wafer (including illustrated transducer wafer portion 82) may now be bonded to a substrate wafer, such as a bulk silicon wafer. FIG. 8 illustrates partially-fabricated MEMS device 80 after wafer-to-wafer bonding wherein only the portion of the substrate wafer included within MEMS device 80 is shown and identified by reference numeral "102." As can be seen in FIG. 8, upper and lower dielectric layers 106 and 108 have been formed over the opposing principal surfaces of MEMS substrate 104. For example, in embodiments wherein MEMS substrate 104 is composed of silicon, dielectric layers 106 and 108 may be produced as thermally-grown silicon oxide films formed by heating substrate 104 in an oxidizing ambient; however, dielectric layer 108 may not be formed in all embodiments or removed, if formed (as described below). Upper dielectric layer 106 has a substantially planar upper surface; and, during joinder of the transducer wafer and substrate wafer, may be bonded to lower dielectric layer 100 of transducer wafer portion 82 along a bond line 110. A fusion bonding technique is preferably employed to join dielectric layers 100 and 106.

High temperature annealing may be performed after substrate bonding to improve the mechanical and chemical properties of the bond interface represented in FIG. 8 by bond line 110. Annealing may be carried-out by exposing partially-fabricated MEMS device 80 to elevated temperatures for a predetermined period of time. In conventional eSOI based MEMS processes, annealing has been performed at highly elevated temperatures exceeding 1000° C., such at a temperatures equivalent to about 1180° C., to equalize etch rates and thereby render the interface between the fusion-bonded layers virtually indistinguishable from the perspective of the release etch. In particular, through the performance of such a high temperature annealing step, the etch rate at the bond interface, which would otherwise be relatively high, can be decreased and brought into closer alignment with the etch rate of the bulk of the fusion-bonded layers. In this manner, when the fusion-bonded layers are etched during the release etch process (as descried above in conjunction with FIG. 2), the mechanical integrity of the bond interface can be generally maintained. However, as the bond interface is no longer exposed to the release etchant during the below-described release etch process, at least in preferred embodiments of the MEMS fabrication processes described herein, such a high temperature annealing process need not be performed. Instead, annealing may be performed at a maximum temperature less than about 900° C. and, in certain instances, less than about 400° C. with little to no reduction in mechanical bond strength. Shielding layers 100 and 106 from exposure to the release etchant also enables layers 100 and 106 to be fabricated from material having disparate etch rates, as described more fully below. The foregoing notwithstanding, the possibility that a high temperature annealing process (e.g., characterized by maximum temperatures exceeding about 1000° C.) can be performed in certain implementations of the MEMS fabrication process is by no means precluded.

Figure 9:
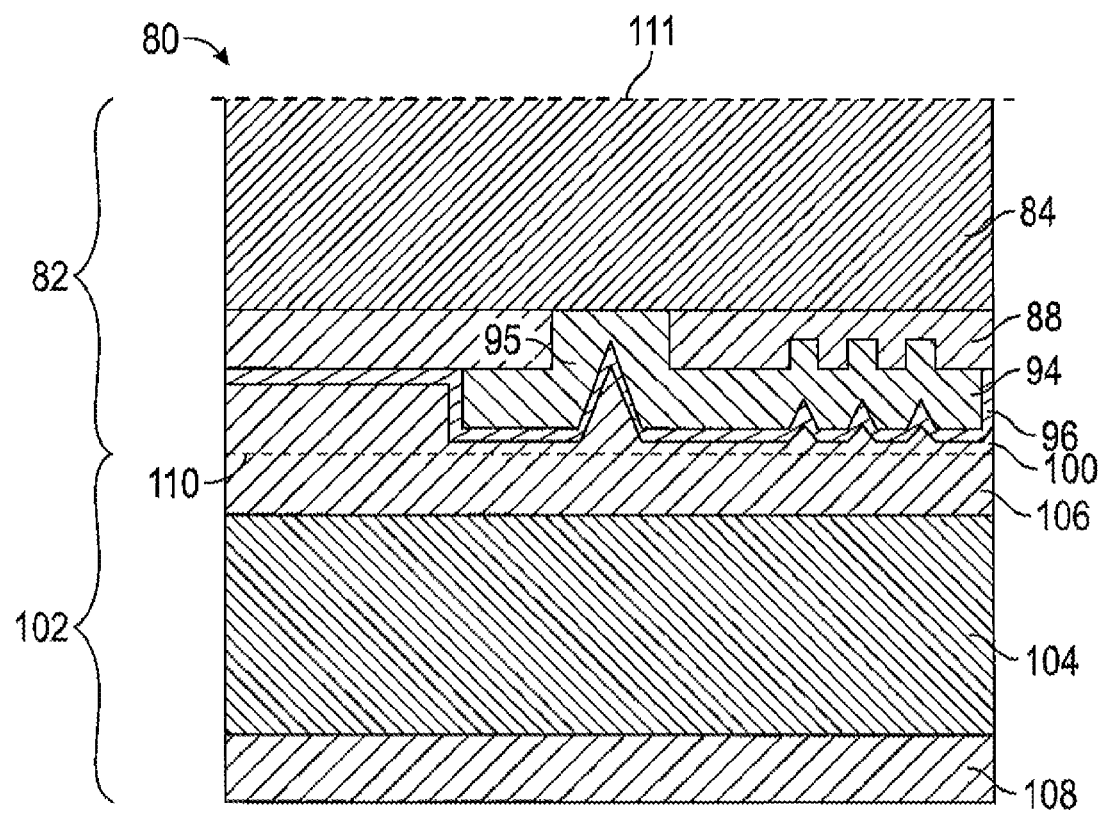
Figure 10:
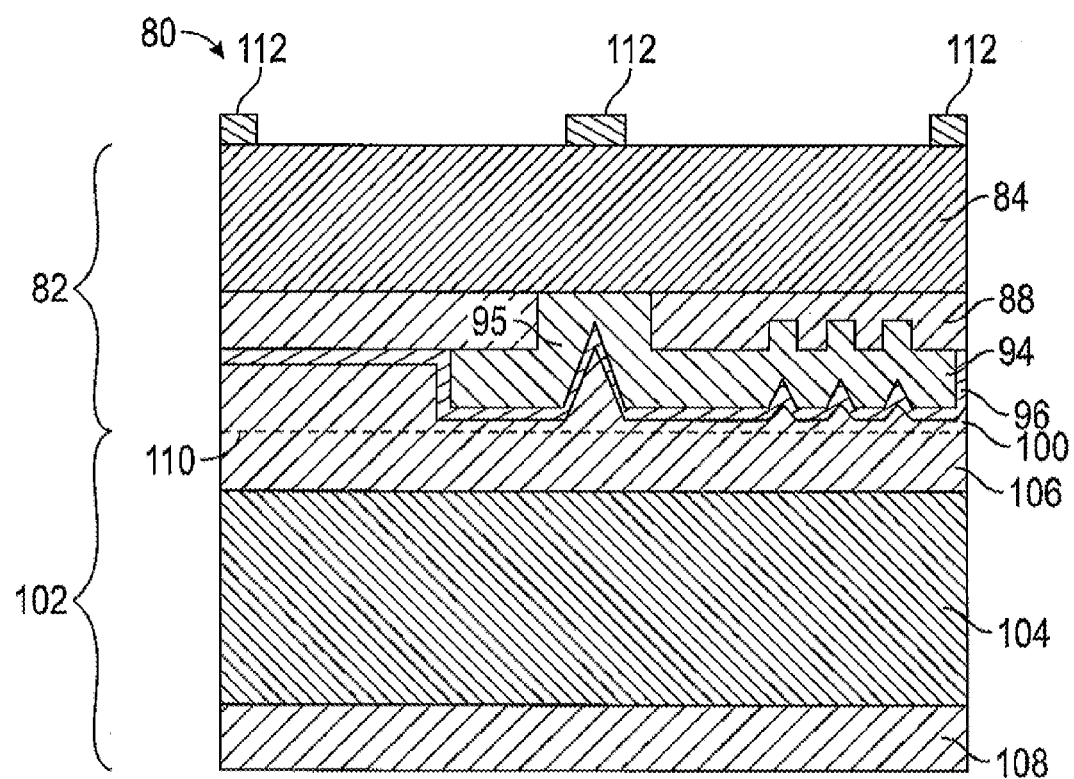
Figure 11:
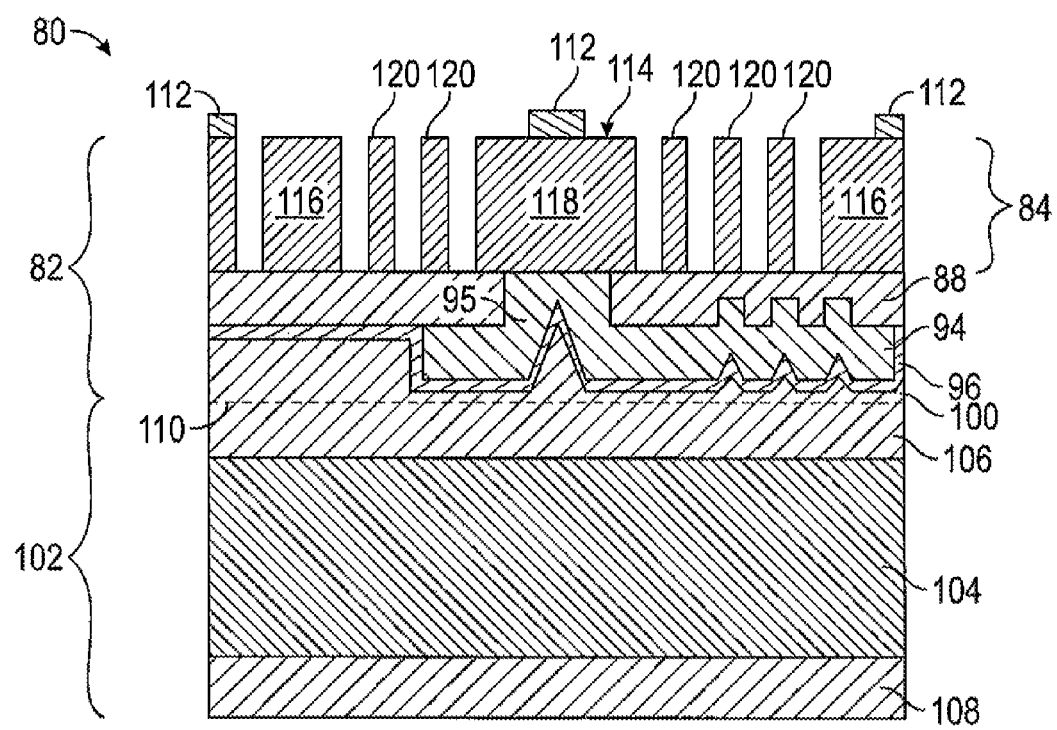
Figure 12:
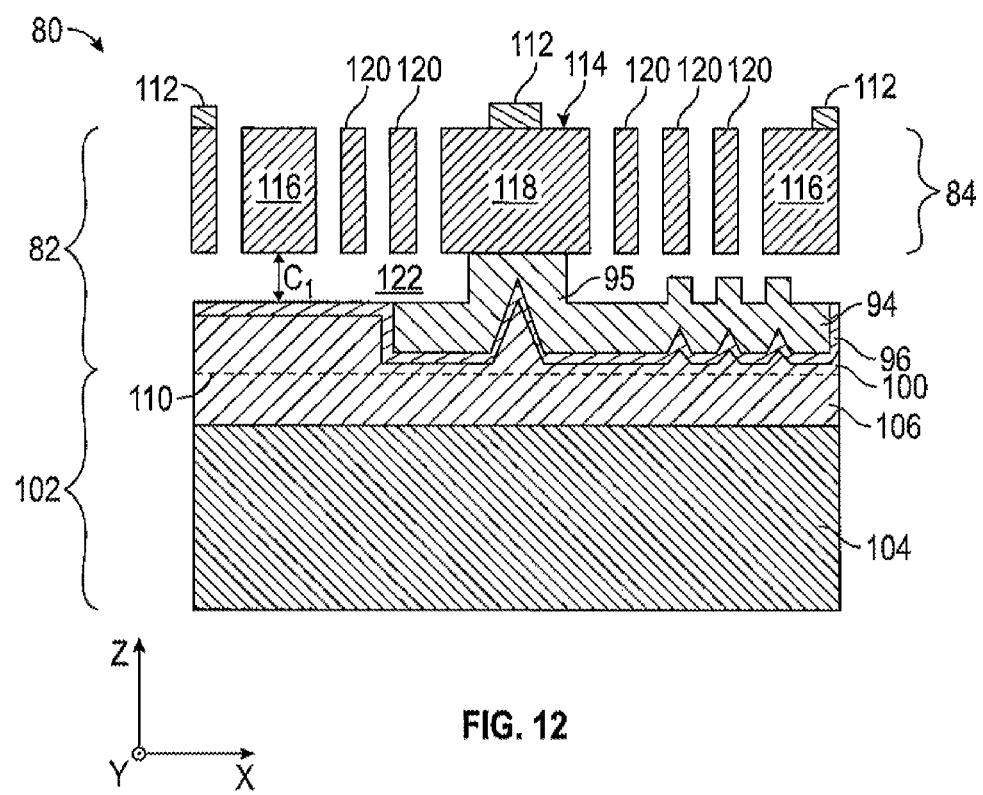
Figure 13:
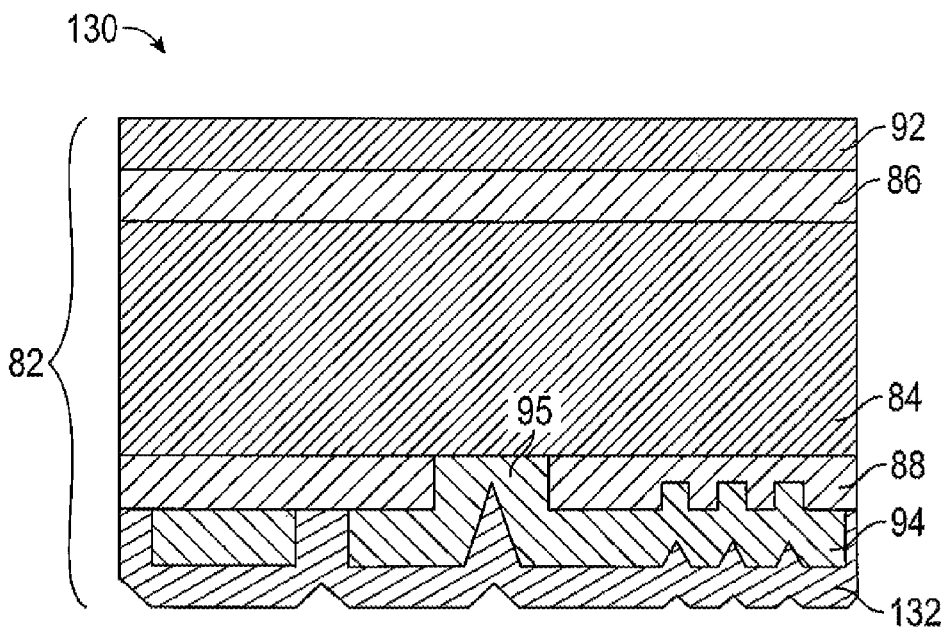
FIGS. 13-18 are simplified cross-sectional view of a MEMS devices shown at various stages of manufacture and fabricated to include at least one release etch stop layer, as illustrated in accordance with a further exemplary embodiment of the present invention.

After wafer-to-wafer bonding, partially-completed MEMS device 80 may undergo further processing to remove the layers overlying electrically-conductive transducer layer 84. More specifically, and as indicated in FIG. 9 by dashed line 111, a CMP, lapping, or grinding process may be utilized to remove electrically-conductive layer 92 along with dielectric layer 86 and an upper portion of electrically-conductive transducer layer 84 to impart layer 84 with a final predetermined thickness; e.g., in an embodiment, transducer layer 84 may be thinned from an initial thickness to a final thickness of, for example, about 25 µm. Eutectic bond pads 112 may then be deposited over selected regions of the newly-exposed upper surface of transducer layer 84 (shown in FIG. 10); although this is by no means necessary in all embodiments. Afterwards, electrically-conductive transducer layer 84 may be lithographically patterned to define a primary transducer structure 114 (only a small portion of which is shown in FIG. 10). As was the case previously, primary transducer structure 114 includes a pattered region 120 (only a small portion of which is shown in FIG. 12), and a number of contact regions 118, which are ohmically coupled to underlying interconnect layer 94 (only one contact region 118 is shown in FIG. 12, which ohmically contacts electrically conductive plug 95 of interconnect layer 94). The illustrated portion of patterned region 120 shown in FIG. 12 may include, for example, a plate having release holes therein and portions of spring members. In other embodiments, patterned region 120 may not include any such etchant release holes. Primary transducer structure 114 is also patterned to include a proof mass (not shown in FIG. 12), which is resiliently joined to one or more anchor regions (also not shown) by the spring members. In an embodiment, the non-illustrated proof mass may have generally rectangular planform shape when MEMS device 80 is viewed from a top-down perspective, while the spring members each have an elongated, beam-like shape. The spring members are compliant in the axis or axes along which MEMS device 80 senses acceleration and thus allow movement of the proof mass relative to MEMS substrate 104 in response to acceleration of MEMS device 80 after removal of sacrificial layer 88 in the below-described manner. Different material removal processes capable of forming high aspect ratio features can be utilized to pattern transducer layer 84 including, for example, deep reactive ion etching (DRIE) processes.

A release etch process is now performed to remove sacrificial layer 88 and mechanically release the proof mass and the spring members. With reference to FIG. 12, removal of sacrificial layer 88 results in the production of void area 122 between patterned transducer layer 84 and interconnect layer 94. During the release etch process, sacrificial dielectric layer 102 may be removed through the transducer layer openings utilizing an etchant having a chemistry selective to the parent material of sacrificial dielectric layer 102; e.g., in embodiments wherein sacrificial dielectric layer 102 is composed of a silicon oxide, a liquid-phase or vapor-phase wet etch utilizing a fluoride-based etch chemistry may be employed. In a preferred embodiment, the release etch is carried-out utilizing a vapor phase hydrogen fluoride etchant. Release etch stop layer 96 deters and, preferably, entirely prevents the ingress of the etchant into the region of partially-completed MEMS device 80 between interconnect layer 94 and MEMS substrate 104. This provides multiple benefits, as described below. After removal of sacrificial layer 88 via the release etch process, conventional processing steps can be performed to complete fabrication of MEMS device 80. Such conventional processing steps may include attachment and further processing of a cap wafer, a "saw-to-reveal" process to remove strips of the MEMS wafers to expose the pads on the cap wafer for probing and wire bonding, and singulation of the processed wafers to yield a number of completed, discrete MEMS devices including MEMS device 80.

As previously indicated, release etch stop layer 96 significantly impedes and, preferably, fully prevents penetration of the release etchant into the region of partially-completed MEMS device 80 underlying interconnect layer 94. In so doing, release etch stop layer 96 prevents exposure of the bond interface (represented by bond line 110 in FIGS. 8-12) to the release etchant. Consequently, little to no material is removed from fusion-bonded dielectric layers 100 and 106 thereby maintaining optimal bond strength along bond line 110 and avoiding concerns regarding excessive material removal from anchor structures formed between interconnect layer 94 and MEMS substrate 104 (dielectric layers 100 and 106, in effect, serving as a single, large anchor structure). As a further advantage, dielectric layers 100 and 106 may now be formed from different materials having disparate etch rates when exposed to the selected release etchant as compared to sacrificial layer 88 without negatively impacting wafer-to-wafer bond strength. As a still further advantage, the release etch can be performed for an extended duration of time to ensure complete removal of sacrificial layer 88 without the provision of etchant inflow openings in patterned transducer layer 84 or with fewer etchant inflow openings provided in layer 84 to reduce the overall footprint of MEMS device 80.

An exemplary embodiment of a method for fabricating a MEMS device including at least one release etch stop layer has thus been provided, which allows greater freedom in the performance of the release etch, improvement lot-to-lot uniformity, and reduction in the overall footprint of the MEMS device. Notably, the foregoing MEMS fabrication method can be implemented with relatively minor modifications to conventional eSOI based MEMS processes and, therefore, without significant increase in the overall cost and duration of the fabrication process. The above-described fabrication process provides a moderate gap or clearance between patterned transducer layer 84 and the underlying release etch stop layer 96, as taken along an axis substantially orthogonal to the upper surface of MEMS substrate 84 (the Z-axis identified in FIG. 12) in a region of MEMS device 80 wherein patterned transducer layer 84 is absent. This clearance is labeled in FIG. 12 as "$C_1$." Such a moderate clearance may be adequate in embodiments wherein displacement of the proof mass along the Z-axis is relatively limited. However, in certain instances, such as when significant displacement of the proof mass along the Z-axis may occur, it may be desirable to provide a greater clearance between patterned transducer layer 84 and underlying etch stop layer 96. Thus, the following further describes two additional embodiments of the MEMS fabrication method wherein this clearance is enlarged. The first embodiment described below in conjunction with FIGS. 13-18 provides a moderate increase in the clearance between the patterned transducer layer and the underlying etch stop layer, while requiring relatively few additional processing steps to implement. The second embodiment described below in conjunction with FIGS. 19-26 provides a relatively large increase in this clearance, but may require the performance of a greater number of processing steps in its implementation.

Figure 14:
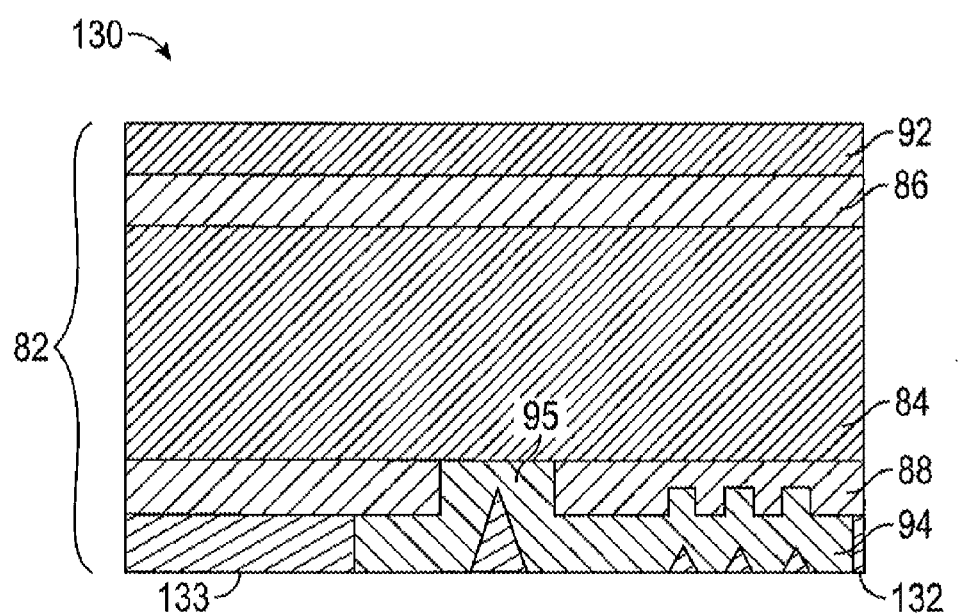

FIGS. 13-18 are simplified cross-sectional view of a MEMS device 130 shown at various stages of manufacture, as illustrated in accordance with a further exemplary embodiment of the present invention. Prior to the juncture of manufacturing shown in FIG. 13, MEMS device 130 is substantially identical to MEMS device 80 described above in conjunction with FIGS. 3-12. Like numbers have thus been utilized to denote like elements for ease of explanation. A variance occurs at the stage of manufacture indicated in FIG. 13 wherein a layer of dielectric material 132, such as an oxide, is first deposited over the lower surface of patterned transducer layer 84 prior to the deposition of the release etch stop layer. A highly-selective CMP process is then carried-out to polish dielectric layer 132 back to interconnect layer 94. The remaining portions of dielectric layer 132 thus effectively serve as a gap fill material, which fills the topological irregularities or non-uniformities present in patterned interconnect layer 94 to impart partially-completed MEMS device 130 with a substantially planar lower surface 133, as shown in FIG. 14. Densification of dielectric layer 132 be performed prior to or after CMP polishing utilizing a high temperature annealing process of the type described above.

Figure 15:
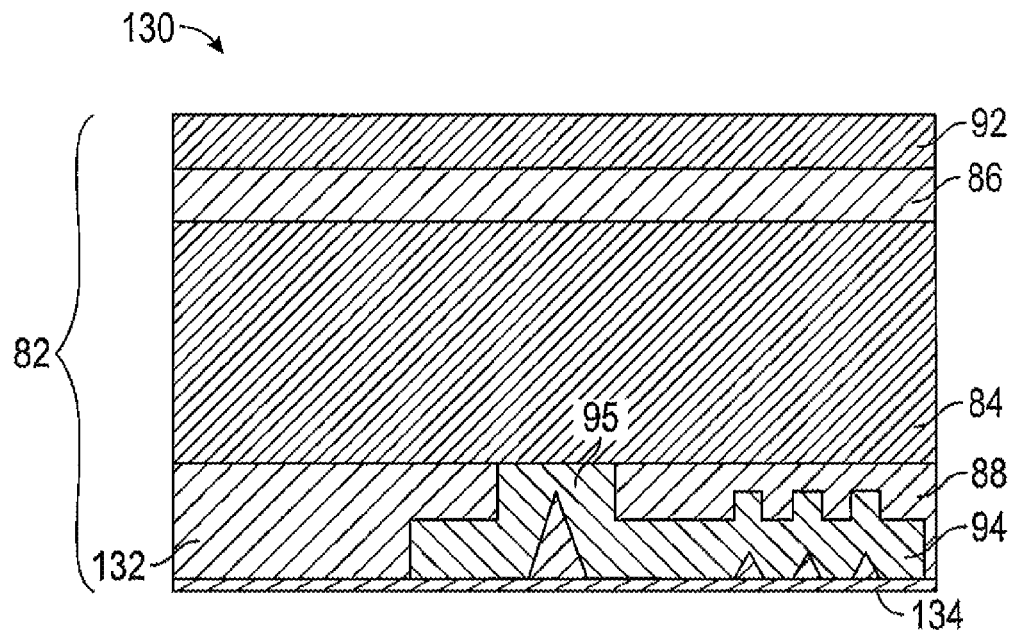
Figure 16:
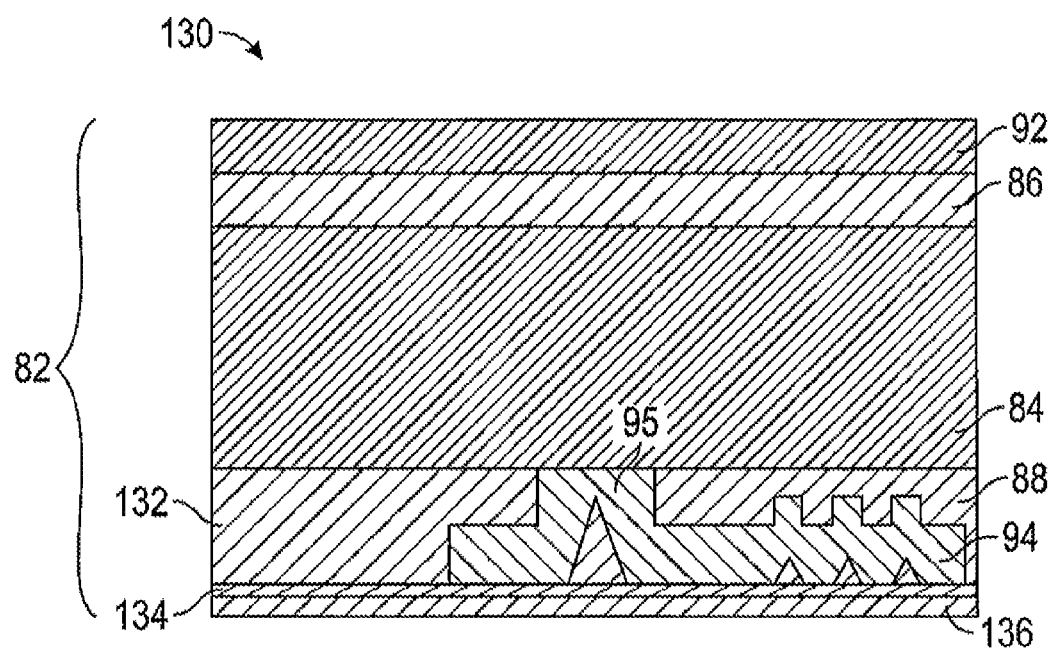
Figure 17:
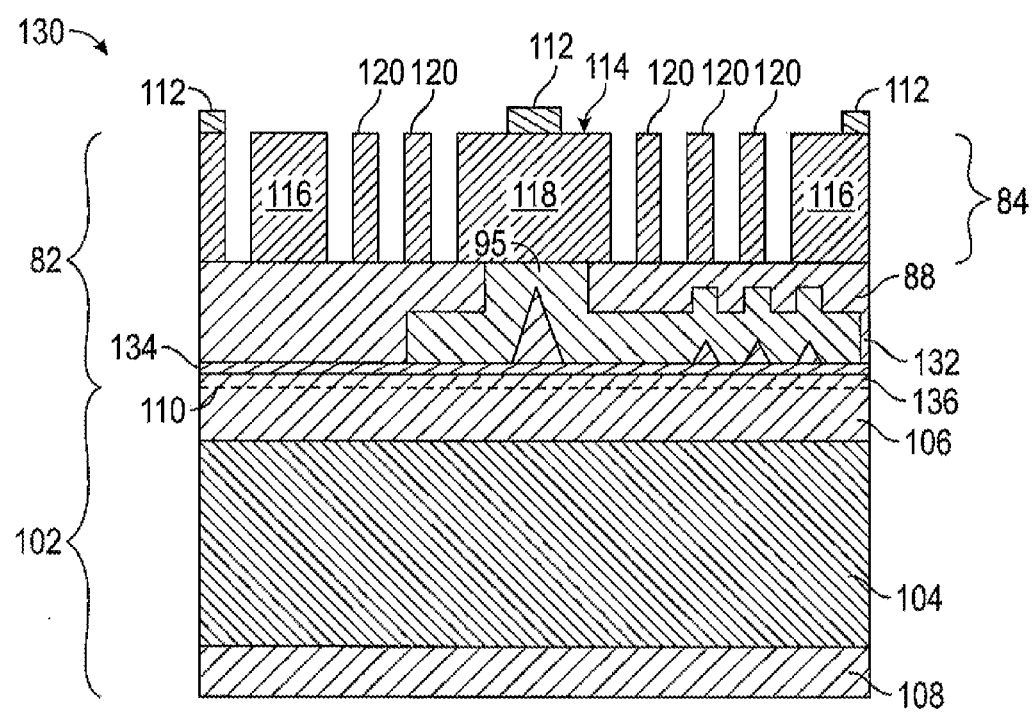
Figure 18:
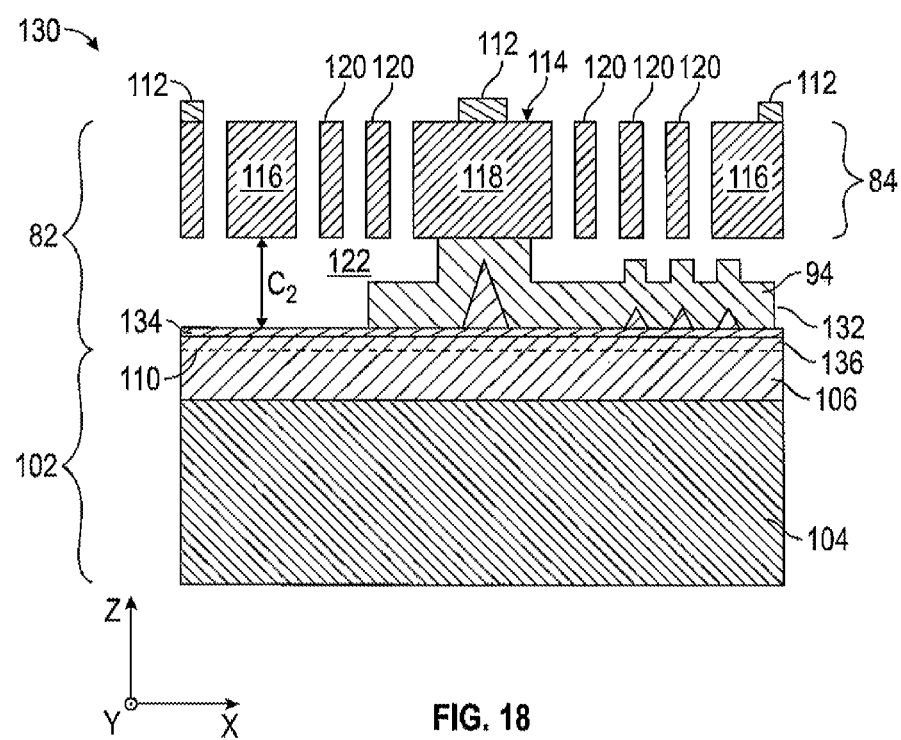
Figure 19:
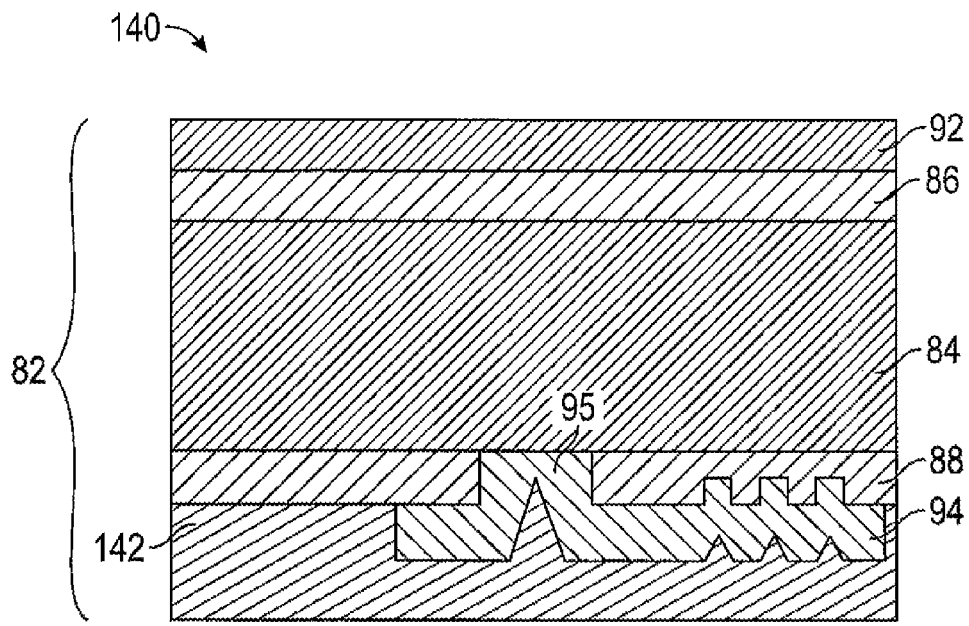
FIGS. 19-26 are simplified cross-sectional view of a MEMS devices shown at various stages of manufacture and fabricated to include at least one release etch stop layer, as illustrated in accordance with a still further exemplary embodiment of the present invention.

With reference to FIG. 15, a release etch stop layer 134 is next deposited over planar lower surface 133 of MEMS device 130. Due to the planar topology of the underlying surface, release etch stop layer 134 is likewise imparted with a planar outer or lower surface. Any of the above-described materials and deposition processes can be utilized to form release etch stop layer 134. From this juncture onward, similar processing steps to those described above in conjunction with FIGS. 3-13 can be carried-out to complete fabrication of MEMS device 130. For example, an oxide or other fusion-bondable layer 136 may be deposited over release etch stop layer 134 (shown in FIG. 16) and fusion bonded to the partially-processed substrate wafer (shown in FIG. 17). The release etch process may then be performed to remove sacrificial layer 88 and mechanically release the proof mass and the spring members of primary transducer structure 114, as previously described. The resultant structure is shown in FIG. 18. As indicated in FIG. 18 by double-headed arrow "$C_2$," a predetermined gap or clearance has been provided between patterned transducer layer 84 and underlying etch stop layer 96, as taken along the Z-axis in regions of MEMS device 130 wherein patterned transducer layer 84 is absent. As may be appreciated by comparing FIG. 18 to FIG. 12, the upper surface of fusion-bonded dielectric layer 136 is now located beneath the level at which patterned interconnect layer 94 resides (as opposed to being substantially flush or even with the upper surface of interconnect layer 94, as shown in FIG. 12). As a result, clearance $C_2$ of MEMS device 130 has been increased as compared to clearance $C_1$ of MEMS device 80 thereby allowing greater displacement of the proof mass and spring members in the Z-direction.

Figure 20:
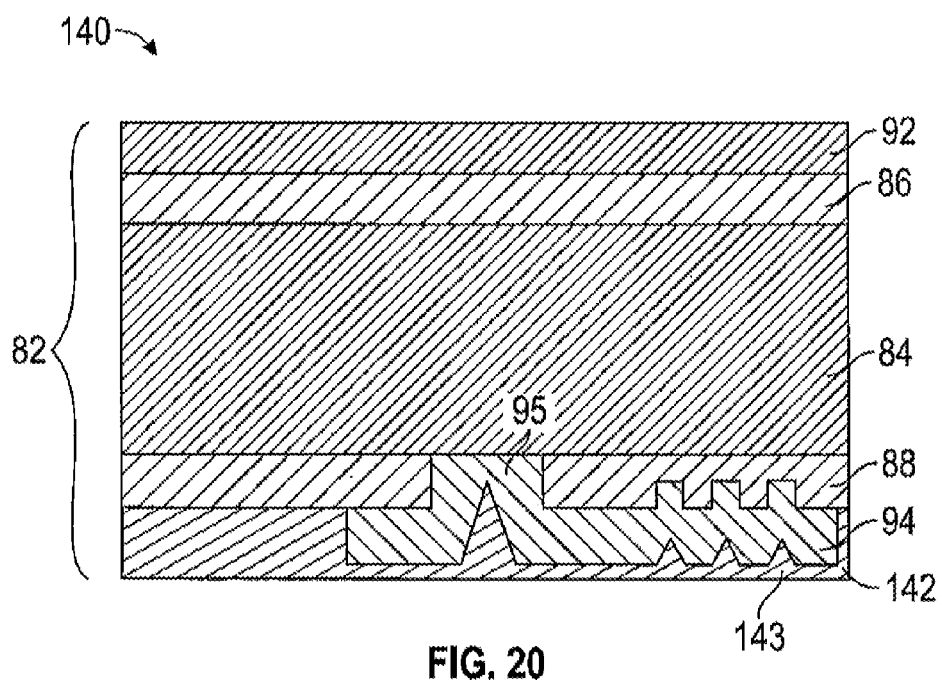

FIGS. 19-26 are simplified cross-sectional view of a MEMS device 140 shown at various stages of manufacture, as illustrated in accordance with a still further exemplary embodiment of the present invention. As was the case previously, like numbers have been utilized to denote like elements. MEMS device 130 is substantially identical to MEMS device 80 described above in conjunction with FIGS. 3-12 prior to the stage of manufacture shown in FIG. 19. Here, a relatively thick layer of dielectric material 142 has been deposited over the lower surface of patterned transducer layer 84 prior to the deposition of the release etch stop layer. Again, dielectric layer 142 is conveniently formed via the deposition of an oxide; e.g., in one embodiment dielectric layer 142 is a silicon oxide deposited utilizing a low temperature PECVD process performed utilizing a silane or TEOS source material. A CMP process is then carried-out to impart dielectric layer 142 and, more generally, MEMS device 140 with substantially planar upper surface 143. However, in contrast to the CMP process described above in conjunction with FIG. 14, the CMP process is preferably halted prior to exposure of patterned transducer layer 84 to leave a relatively thin layer of dielectric material overlying transducer layer 84. The resultant structure is shown in FIG. 20.

Figure 21:
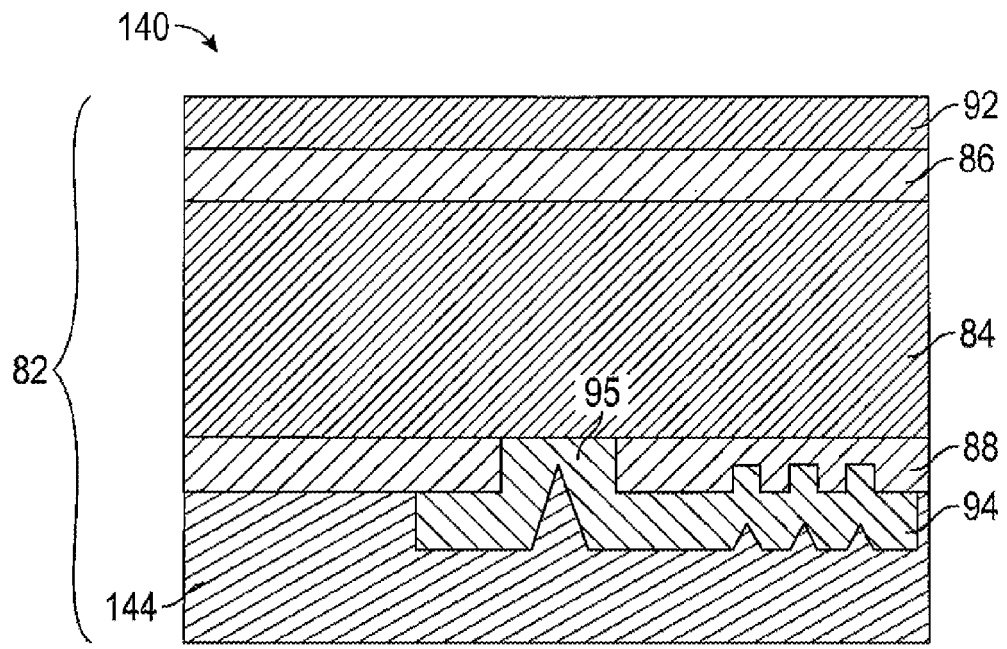
Figure 22:
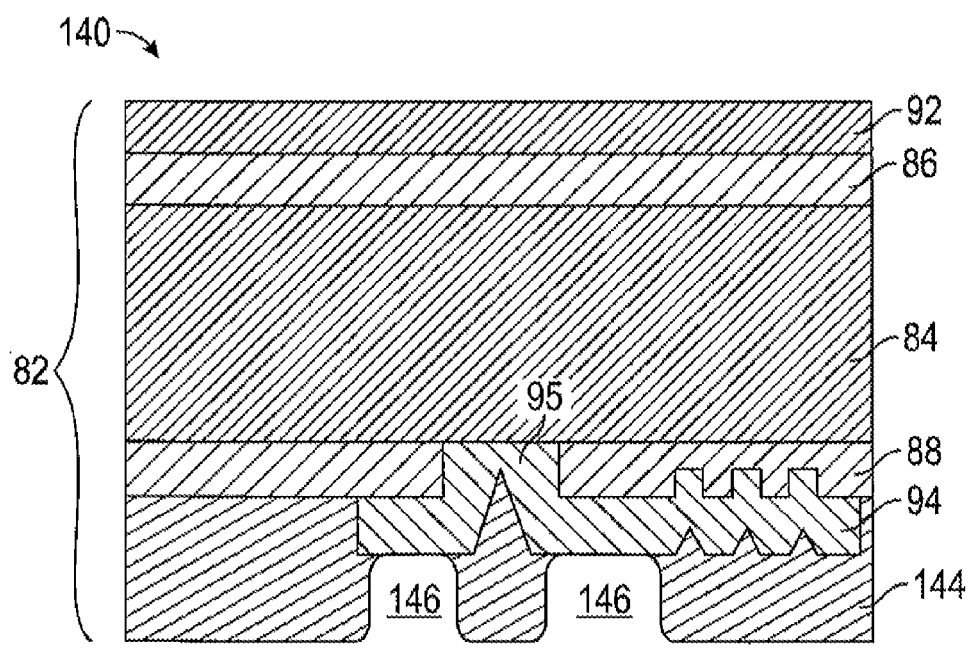
Figure 23:
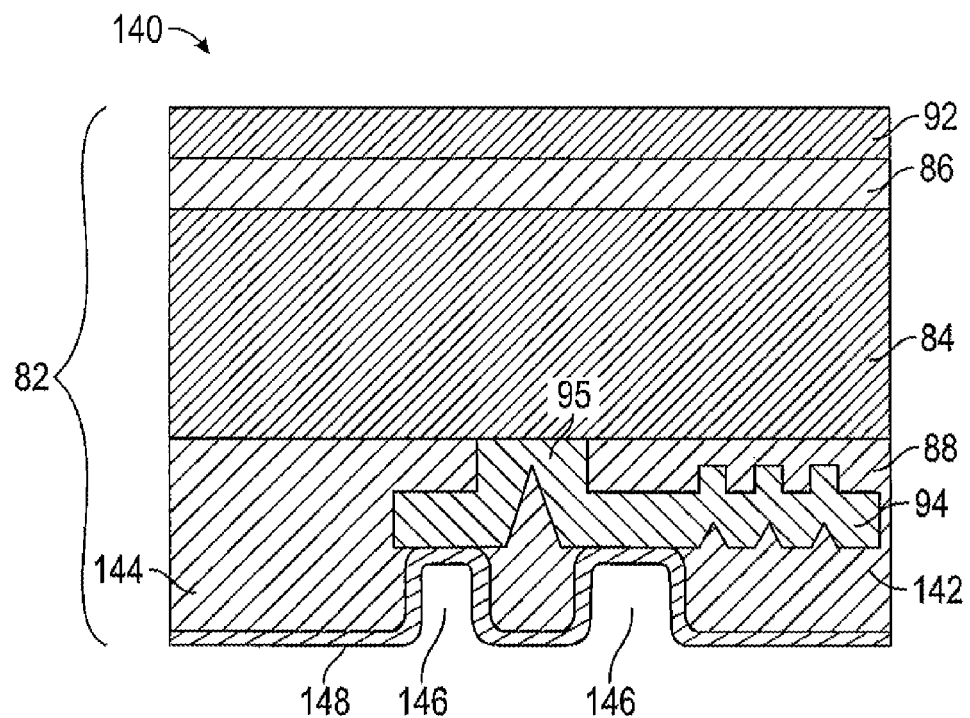
Figure 24:
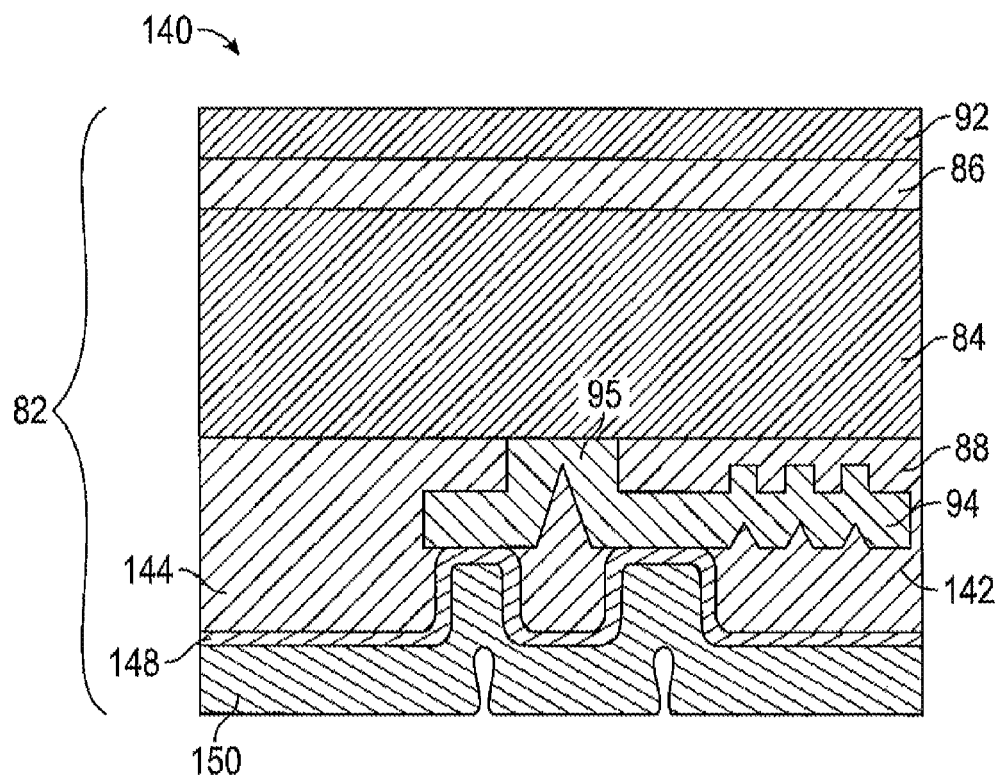
Figure 25:
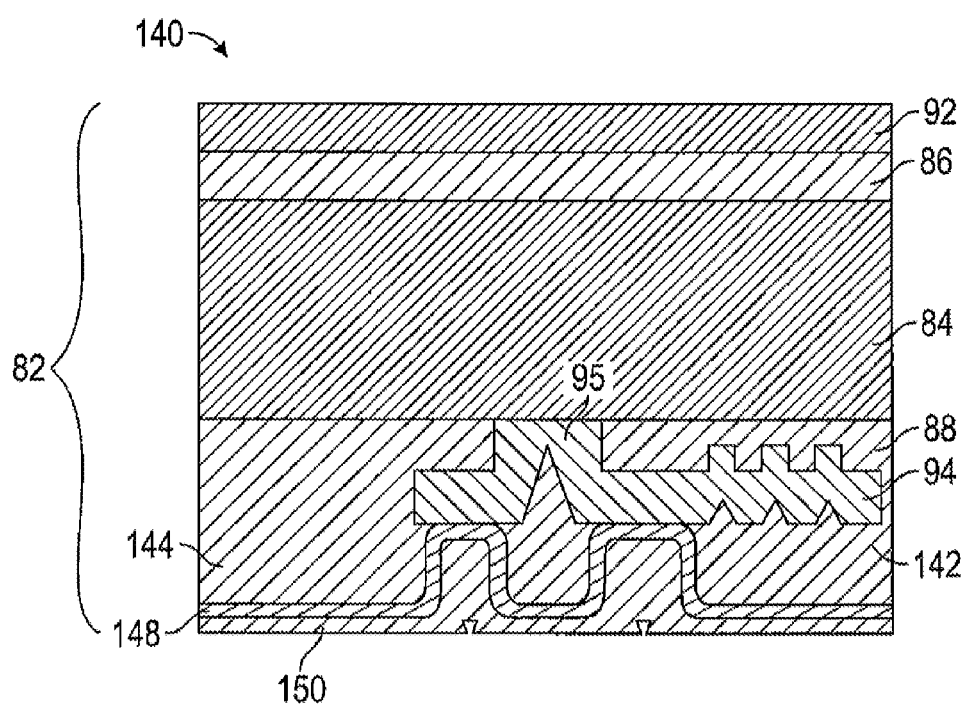

Additional dielectric material is next deposited over planarized dielectric layer 142 to increase the thickness thereof, as indicated in FIG. 21 wherein the newly-thickened dielectric layer is identified by reference numeral "144." Turning to FIG. 22, a number of cavities or openings 146 are then formed into dielectric layer 144 using, for example, a selective etching process. Openings 146 extend through dielectric layer 144 to patterned transducer layer 84 and are ultimately filled with a non-sacrificial dielectric material to form a number of vertical standoff features, as described below in conjunction with FIG. 26. At least one etch stop layer 148 is then deposited over dielectric layer 114, into openings 146, and contacts the portions of patterned transducer layer 84 exposed therethrough. Release etch stop layer 148 can be produced utilizing any of the above-described materials and deposition processes. Processing steps similar to those described above are then carried-out to complete fabrication of MEMS device 140; e.g., an oxide or other fusion-bondable layer 150 may be deposited over release etch stop layer 148 and into openings 146 (shown in FIG. 24), layer 150 may then be planarized and possibly densified (shown in FIG. 25), and then fusion bonded to a partially-processed substrate wafer of the type previously described.

Figure 26:
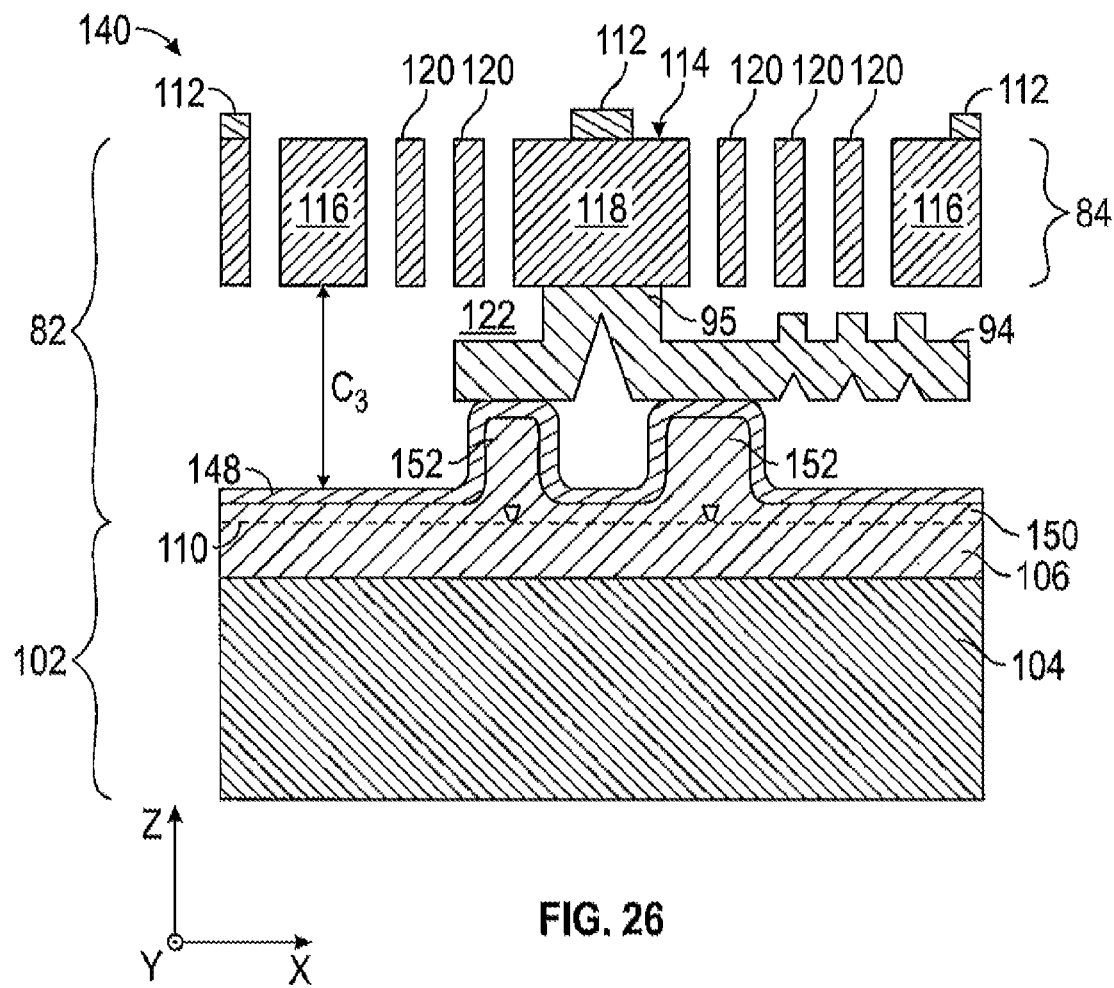

FIG. 26 illustrates MEMS device 140 after performance of the release etch process. As can be seen, the release etch has resulted in the complete removal of sacrificial layer 144 and, therefore, the release of the proof mass and the spring members of primary transducer structure 114. Notably, filling of openings 146 (identified in FIGS. 22 and 23) with dielectric material during formation of dielectric layer 150 (FIG. 24) has resulted in the formation of vertical standoff features 152, which project upwardly from MEMS substrate 104 toward patterned transducer layer 84 and which are enveloped or encapsulated by release etch stop layer 148. Vertical standoff features 152 serve to augment the clearance (identified in FIG. 26 as "$C_3$") between patterned transducer layer 84 and underlying etch stop layer 96, as taken along the Z-axis in regions of MEMS device 140 wherein patterned transducer layer 84 is absent. In so doing, vertical standoff features 152 allow clearance $C_3$ to be increased to virtually any desired dimension limited only by mechanical strength constraints thereby allowing significant displacement of the proof mass in the Z-direction.

The foregoing has thus provided embodiments of a method for fabricating MEMS devices including release etch stop layers, which serve as dams or barriers to prevent or deter the ingress of a selected release etchant into certain regions of the partially-completed MEMS device during the release etch process. In embodiments wherein an eSOI based MEMS fabrication process is utilized to produce the MEMS device, this allows the bond interface between the transducer wafer and the substrate wafer to be isolated form the release etchant thereby maintaining optimal wafer-to-wafer bond strength. Furthermore, the above-described fabrication process effectively renders the release etch process time independent and alleviates concerns regarding excessive removal of material from anchor structures located between the interconnect layer and the MEMS substrate. A prolonged release etch can thus be performed, at least in some embodiments, to ensure removal of the sacrificial layer or layers located between the transducer layer and the interconnect layer without the provision of additional etchant inflow openings (or with fewer etchant inflow openings) in the patterned transducer layer to bring about a reduction in the overall footprint of the MEMS device. In this manner, embodiments of the MEMS fabrication method enable a per-design constraint on the sacrificial release material volume and well-controlled anchor designs, allowing a signification size reduction of the MEMS device. Additionally, for engineered wafers based on fusion bonding, the barrier layer eliminates requirements for closely-matched etch rates for dielectric (e.g., oxide) layers underneath the movable part in favor of a pure mechanical constrain on the fusion bond strength, at least in some embodiments.

While, in the above-described exemplary embodiments, two planar oxide layers were bonded during wafer-to-wafer bonding, other types of layer pairs can be fusion bonded or otherwise joined together during the wafer-to-wafer bonding process including oxide-to-silicon, silicon-to-oxide, and silicon-to-silicon layer pairs with one of the two layers initially included in a transducer wafer and the other layer initially included in the substrate or handle wafer. Furthermore, although described above in conjunction with a particular type of MEMS device, namely, an accelerometer, it is emphasized that embodiments of the fabrication method can be utilized to produce various different types of MEMS devices including, but not limited to, MEMS actuators and other types of MEMS sensors, such as gyroscopes and pressure sensors.

In one embodiment of the above-described MEMS fabrication method, the method includes the step or process of bonding a transducer wafer to a substrate wafer along a bond interface, the transducer wafer comprising an unpatterned transducer layer overlying a sacrificial layer. The unpatterned transducer layer is patterned to yield a patterned transducer layer having a number of openings therein defining a primary transducer structure. A release etch process is then performed during which the sacrificial layer is exposed to a selected release etchant to remove at a least a portion of the sacrificial layer through the openings in the patterned transducer layer and release the movable components (e.g., spring members and proof mass) of the primary transducer structure. Prior to exposing the sacrificial layer to the release etchant, a release etch stop layer is deposited or otherwise formed between the sacrificial layer and the bond interface. The release etch stop layer substantially prevents the ingress of the selected release etchant into the region of the MEMS device containing the bond interface during the release etch process.

In another embodiment, the MEMS fabrication method commences with the step or process of providing a partially-completed MEMS device including: (i) a MEMS substrate, (ii) a release etch stop layer overlying the MEMS substrate, (iii) a sacrificial layer overlying the release etch stop layer, and (iv) an unpatterned transducer layer overlying the sacrificial layer. The partially-completed MEMS device can be provided by independent fabrication or by purchase form a third party. The unpatterned transducer layer is patterned to yield a patterned transducer layer having a number of openings therein. A release etch process is then performed during which the sacrificial layer is exposed to a release etchant to remove at least a portion of the sacrificial layer through the openings in the patterned transducer layer. The release etch stop layer prevents the release etchant from penetrating into a region of the partially-completed MEMS device between the MEMS substrate and the release etch stop layer during the release etch process.

Embodiments of a MEMS device have also been provided. In one embodiment, the MEMS device includes a substrate wafer portion and a transducer wafer portion, which is bonded to the substrate wafer portion along a bond interface. The transducer wafer portion includes, in turn, a patterned transducer layer and a release etch stop layer, which is formed between the patterned transducer layer and the bond interface. In some embodiments, the transducer wafer portion may also include an interconnect layer underlying and ohmically coupled to the patterned transducer layer, in which case the release etch stop layer may be formed under and contact at least a portion of the interconnect layer. Also, in further embodiments, the MEMS device may include a first oxide layer included within the substrate wafer portion, as well as a second oxide layer included within the transducer wafer portion and fusion bonded to the first oxide layer along the bond interface. In such embodiments, the material from which the release etch stop layer is formed may have an etch rate less than the first oxide layer and less than the second oxide layer when exposed to a hydrogen fluoride-based etchant or other etchant utilized during the above-described release etch process.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention, as set-forth in the appended claims.

The invention claimed is:

1. A Microelectromechanical Systems ("MEMS") device, comprising:
   a substrate wafer portion comprising:
      a MEMS substrate having opposite upper and lower principal surfaces; and
      an upper dielectric layer formed over the upper principal surface of the MEMS substrate; and
   a transducer wafer portion bonded to the substrate wafer portion along a bond interface, the transducer wafer portion comprising:
      a patterned transducer layer;
      an electrically-conductive interconnect layer formed below and partially ohmically contacting a bottom surface of the patterned transducer layer with an electrically-conductive plug thereof;
      a void area partially between the patterned transducer layer and the electrically-conductive interconnect layer formed by etching a sacrificial layer previously located between the patterned transducer layer and the electrically-conductive interconnect layer with an etchant; and a release etch stop layer formed between the patterned transducer layer and the bond interface that deters ingress of the etchant into the upper dielectric layer.

2. The MEMS device of claim 1, wherein the transducer wafer portion further comprises an interconnect layer underlying and ohmically coupled to at least one region of the patterned transducer layer, the release etch stop layer formed under and contacting at least a portion of the interconnect layer.

3. The MEMS device of claim 1, further comprising:
   a first oxide layer included within the substrate wafer portion; and
   a second oxide layer included within the transducer wafer portion and fusion bonded to the first oxide layer along the bond interface, the release etch stop layer having an etch rate less than the first oxide layer and less than the second oxide layer when exposed to a hydrogen fluoride-based etchant.

4. The MEMS device of claim 1, wherein the release etch stop layer comprises a material selected from the group consisting of an aluminum oxide and an aluminum fluoride.

\* \* \* \* \*